(12) United States Patent
Ono et al.

(10) Patent No.: US 10,991,737 B2
(45) Date of Patent: Apr. 27, 2021

US010991737B2

(54) SOLID-STATE IMAGING DEVICE AND IMAGE SENSOR FOR SUPPRESSING OR PREVENTING LEAKING OF LIGHT INTO ADJOINING PIXELS

(71) Applicant: Mitsubishi Electric Corporation, Chiyoda-ku (JP)

(72) Inventors: Masaki Ono, Chiyoda-ku (JP); Masatoshi Kodama, Chiyoda-ku (JP); Naoyuki Tokida, Chiyoda-ku (JP); Akiko Fujiuchi, Chiyoda-ku (JP); Keisuke Nakamura, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 41 days.

(21) Appl. No.: 16/092,133

(22) PCT Filed: May 17, 2017

(86) PCT No.: PCT/JP2017/018537
§ 371 (c)(1),
(2) Date: Oct. 8, 2018

(87) PCT Pub. No.: WO2017/200007
PCT Pub. Date: Nov. 23, 2017

(65) Prior Publication Data

US 2019/0165021 A1 May 30, 2019

(30) Foreign Application Priority Data

May 19, 2016 (JP) ............................ JP2016-100686

(51) Int. Cl.
*H01L 27/146* (2006.01)
*G02B 5/22* (2006.01)
(Continued)

(52) U.S. Cl.
CPC .......... *H01L 27/14621* (2013.01); *G02B 5/20* (2013.01); *G02B 5/208* (2013.01);
(Continued)

(58) Field of Classification Search
CPC ............. H01L 27/14621; H01L 27/146; H01L 27/14652; H01L 2/14645; H04N 9/07;
(Continued)

(56) References Cited

U.S. PATENT DOCUMENTS

| | | | | |
|---|---|---|---|---|
| 5,453,611 A | | 9/1995 | Hayao et al. | |
| 5,796,154 A | * | 8/1998 | Sano | H01L 27/14621 257/432 |

(Continued)

FOREIGN PATENT DOCUMENTS

| | | |
|---|---|---|
| JP | 6-204444 A | 7/1994 |
| JP | 6-217079 A | 8/1994 |

(Continued)

OTHER PUBLICATIONS

International Search Report dated Aug. 22, 2017 in PCT/JP2017/018537 filed May 17, 2017.

(Continued)

*Primary Examiner* — Jennifer D Bennett
(74) *Attorney, Agent, or Firm* — Oblon, McClelland, Maier & Neustadt, L.L.P.

(57) ABSTRACT

A solid-state imaging device includes blue photoelectric conversion elements, green photoelectric conversion elements, red photoelectric conversion elements, infrared photoelectric conversion elements, and an infrared cut filter (IRCF) is layered on the blue photoelectric conversion elements, the green photoelectric conversion elements, and the red photoelectric conversion elements with a uniform film thickness. Color filters that respectively transmit the blue light, the green light, and the red light are layered on the (Continued)

IRCF so as to correspond with the blue photoelectric conversion elements, the green photoelectric conversion elements, and the red photoelectric conversion elements. A visible-light shielding filter is layered on the infrared photoelectric conversion elements. An ultraviolet cut filter layered between the photoelectric conversion elements other than the infrared photoelectric conversion elements and the IRCF, and between the infrared photoelectric conversion elements and the visible-light shielding filter with a uniform film thickness.

2 Claims, 9 Drawing Sheets

(51) Int. Cl.

| | |
|---|---|
| ***H04N 1/028*** | (2006.01) |
| ***H04N 9/07*** | (2006.01) |
| ***G02B 5/20*** | (2006.01) |
| ***G02B 5/28*** | (2006.01) |

(52) U.S. Cl.

CPC ............... *G02B 5/22* (2013.01); *G02B 5/281* (2013.01); *H01L 27/146* (2013.01); *H01L 27/14645* (2013.01); *H01L 27/14652* (2013.01); *H04N 1/028* (2013.01); *H04N 9/07* (2013.01)

(58) Field of Classification Search

CPC .......... H04N 1/028; G02B 5/205; G02B 5/22; G02B 5/281; G02B 5/20

See application file for complete search history.

(56) References Cited

U.S. PATENT DOCUMENTS

| | | | | |
|---|---|---|---|---|
| 2005/0017245 | A1 * | 1/2005 | Manabe ............ | H01L 27/14609 257/72 |
| 2006/0170069 | A1 * | 8/2006 | Kim .................. | H01L 27/14627 257/432 |
| 2007/0010042 | A1 * | 1/2007 | Li ...................... | H01L 27/14685 438/70 |
| 2008/0067330 | A1 | 3/2008 | Atsushi | |
| 2010/0102234 | A1 * | 4/2010 | Hamasaki .............. | G07D 7/121 250/341.7 |
| 2015/0221691 | A1 * | 8/2015 | Watanabe .............. | H04N 5/332 348/164 |
| 2015/0381907 | A1 * | 12/2015 | Boettiger ............... | H04N 5/332 348/164 |
| 2016/0099272 | A1 | 4/2016 | Wei-Ko | |
| 2016/0099280 | A1 | 4/2016 | Tzu-Wei et al. | |

FOREIGN PATENT DOCUMENTS

| | | | |
|---|---|---|---|
| JP | 2003-318374 | A | 11/2003 |
| JP | 2005-184293 | A | 7/2005 |
| JP | 2008-5213 | A | 1/2008 |
| JP | 2008-76084 | A | 4/2008 |
| JP | 2016-76682 | A | 5/2016 |

OTHER PUBLICATIONS

Japanese Office Action dated Dec. 8, 2017 in Patent Application No. 2017-559717 (with English Translation).

* cited by examiner

SOLID-STATE IMAGING DEVICE AND IMAGE SENSOR FOR SUPPRESSING OR PREVENTING LEAKING OF LIGHT INTO ADJOINING PIXELS

TECHNICAL FIELD

The present disclosure relates to a solid-state imaging device that includes photoelectric conversion elements and to an image sensor.

BACKGROUND ART

An image sensor that reads a reading-target image that is printed with ink that reacts to ultraviolet light, blue light, green light, red light, and infrared light has to read the image in each of the wavelength ranges of ultraviolet light, blue light, green light, red light, and infrared light. The reading-target is, for example, a bank bill or a security certificate. An image sensor that reads color images is generally provided with photoelectric conversion elements for one line and reads one line in different colors by switching light sources of different colors to emit light sequentially for each line. Alternatively, for example, lines of photoelectric conversion elements are provided on which color filters that transmit different colors by line are layered. Lights of wavelengths of different colors are emitted at the same time to read an image in lines at different positions depending on the color and a color image is obtained by aligning the line positions of the read images.

In recent years, solid-state imaging devices tend to require smaller and faster photoelectric conversion elements. In the system of switching LEDs of different wavelength ranges to emit light sequentially as the light source of a solid-state imaging device, it takes time to read one line, and thus it is difficult to improve the reading speed. Therefore, there is a demand for a system in which color filters that transmit light of specific wavelengths each corresponding to a wavelength range to be read are layered on the photoelectric conversion elements, and lights of multiple wavelengths are emitted at the same time to read images of different wavelength ranges at the same time, thereby improving the reading speed.

A solid-state imaging device that includes color filters on light-reception elements is disclosed in Patent Literature 1. The solid-state imaging device of the Patent Literature 1 includes a receiver in which color filters that transmit only any of blue light, green light, and red light are formed on photodiodes and an infrared cut filter (IRCF) that transmits visible light and cuts infrared light is layered thereon.

Patent Literature 2 discloses a solid-state imaging device that obtains images in different colors at the same time using a single light source with an image sensor having, in each array of photosensors, filters that transmit any light of blue (B), green (G), red (R), and intermediate colors on the photosensors.

CITATION LIST

Patent Literature

Patent Literature 1: Unexamined Japanese Patent Application Kokai Publication No. 2008-5213; and Patent Literature 2: Unexamined Japanese Patent Application Kokai Publication No. 2005-184293.

SUMMARY OF INVENTION

Technical Problem

In the structure in which color filters and an infrared cut filter (IRCF) are layered on photoelectric conversion elements as described in the Patent Literature 1, the color filters and the IRCF are generally formed by layering pigment-added materials on the photoelectric conversion elements. Highly accurate film thickness control and uniformity are important for this production method.

The film thicknesses of color filters are determined according to the color purity of light of wavelengths desired to be transmitted and thus are different between the colors. Therefore, the structure in which color filters are layered on photoelectric conversion elements and an IRCF is layered on the colored filters as described in the Patent Literature 1 raises concerns about problems such as leaking of light into adjoining pixels due to the step that exists between adjoining color filters and unstable characteristics of the IRCF due to insufficient flatness of the color filters.

The technique described in the Patent Literature 2 presents the structure in which an intermediate color filter is provided in addition to the color filter for three primary colors; blue (B), green (G), and red (R) to obtain an excellent quality image, but the structure cannot receive infrared light.

The present disclosure is made with the view of the above situation and an objective of the disclosure is to suppress or prevent leaking of light into adjoining pixels and ensure characteristics of the IRCF in a solid-state imaging device using the color filters.

Solution to Problem

In order to achieve the above objective, the solid-state imaging device according to the present disclosure includes a red photoelectric conversion element, a green photoelectric conversion element, a blue photoelectric conversion element, an infrared photoelectric conversion element, an infrared cut filter to cut infrared light, a red filter to transmit light of red wavelengths, a green filter to transmit light of green wavelengths, a blue filter to transmit light of blue wavelengths, and a visible-light shielding filter to transmit infrared light and shield red light, green light, and blue light. The red photoelectric conversion element receives and converts red light to electric signals. The green photoelectric conversion element receives and converts green light to electric signals. The blue photoelectric conversion element receives and converts blue light to electric signals. The infrared photoelectric conversion element receives and converts infrared light to electric signals. The infrared cut filter is layered on each of the red photoelectric conversion element, the green photoelectric conversion element, and the blue photoelectric conversion element with a uniform film thickness. The red filter is layered on the infrared cut filter above the red photoelectric conversion element. The green filter is layered on the infrared cut filter above the green photoelectric conversion element. The blue filter layered on the infrared cut filter above the blue photoelectric conversion element. The visible-light shielding filter is layered on the infrared photoelectric conversion element. The solid-state imaging device further includes an ultraviolet cut filter layered between (i) the red photoelectric conversion element, the green photoelectric conversion element, and the blue photoelectric conversion element and (ii) the infrared cut filter and between (iii) the infrared photoelectric conversion element and (iv) the visible-light shielding filter with a uniform film thickness, the ultraviolet cut filter transmitting infrared light and visible light and cutting ultraviolet light.

Advantageous Effects of Invention

According to the present disclosure, the infrared cut filter (IRCF) is first layered on the photoelectric conversion elements and the color filters are layered on the IRCF in a solid-state imaging device using the color filters, thereby enabling suppression or prevention of leaking of light into adjoining pixels and ensuring characteristics of the IRCF.

DESCRIPTION OF EMBODIMENTS

Modes for implementing the present disclosure will be described in detail below with reference to the drawings. Throughout the drawings, the same or equivalent parts are referred to by the same reference signs.

Embodiment 1

Figure 1:
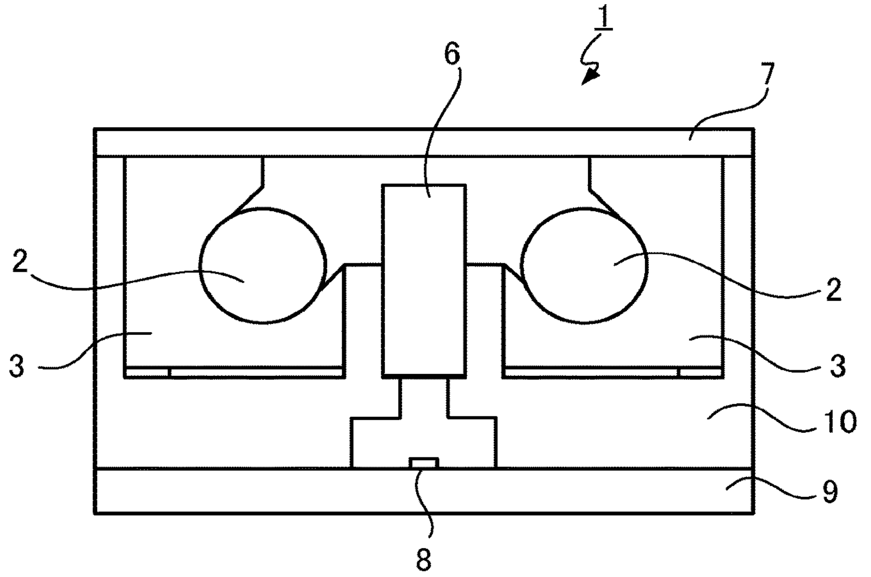
FIG. 1 is a cross-sectional view orthogonal to the main scan direction of an image sensor according to Embodiment 1 of the present disclosure.

FIG. 1 is a cross-sectional view orthogonal to the main scan direction of an image sensor according to Embodiment 1 of the present disclosure. The main scan direction is the direction orthogonal to the sheet face of FIG. 1. An image sensor 1 includes light guides 2 that extend in the main scan direction and emit light from the sides to a reading target, light guide casings 3 that hold the light guides 2, lenses 6 that are arranged in the main scan direction and each form an image of the reading target, a transparent plate 7 that is interposed between the lenses 6 and the reading target, a solid-state imaging device 8 that converts the images that are formed by the lenses 6 to electric signals and outputs the electric signals, a sensor substrate 9 on which the solid-state imaging device 8 is mounted, and an enclosure 10 that holds these members. The direction parallel to the top surface of the transparent plate 7 and orthogonal to the main scan direction is the sub scan direction.

Upon emitting visible light and infrared light to an end face of the light guides 2 by light sources, light enters the light guides 2 and propagates in the main scan direction. From the sides of the light guides 2, the visible light and the infrared light is emitted to a reading target. The light guide casings 3 include reflecting plates that extend in the main scan direction. Light that leaks from the sides of the light guides 2 into the light guide casings 3 is reflected by the reflecting plates of the light guide casings 3 and reenters the light guides 2. The light guides 2 and non-illustrated light sources constitute an emitter. The lenses 6 form images of the reading target to which the visible light and the infrared light are emitted on the solid-state imaging device 8. The solid-state imaging device 8 photoelectrically-converts the images that are formed by the lenses 6 to electric signals corresponding to the intensity of light that falls on the elements.

The image sensor 1 includes two light guides 2 that are juxtaposed in the sub scan direction with the lenses 6 in-between. The quantities of the light sources and the light guides 2 are not limited to two.

Figure 2:
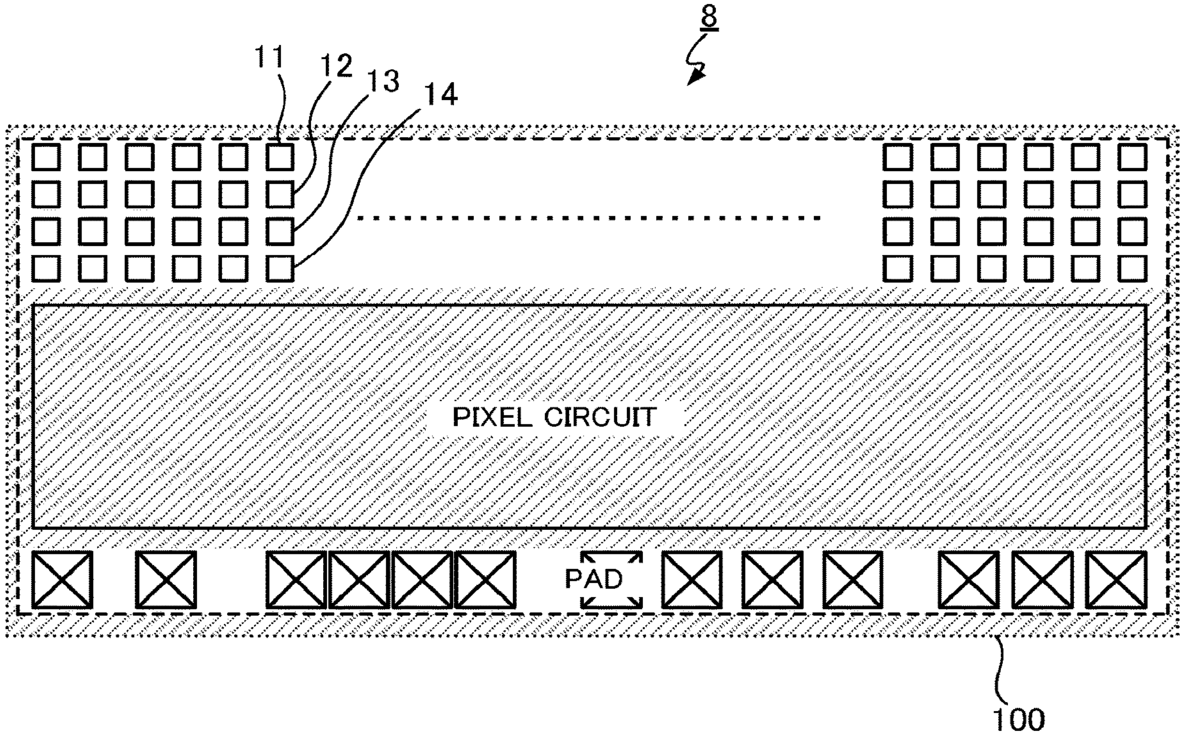
FIG. 2 is a layout diagram of photoelectric conversion elements in a solid-state imaging device according to Embodiment 1.

FIG. 2 is a layout diagram of the photoelectric conversion elements of the solid-state imaging device according to Embodiment 1. The solid-state imaging device 8 includes, on a semiconductor substrate 100, a total of four rows: one row of blue photoelectric conversion elements 11 that receive and convert blue light to electric signals, one row of green photoelectric conversion elements 12 that receive and convert green light to electric signals, one row of red photoelectric conversion elements 13 that receive and convert red light to electric signals, and one row of infrared photoelectric conversion elements 14 that receive and convert infrared light to electric signals, in the main scan direction. Hereafter, the blue photoelectric conversion elements 11, the green photoelectric conversion elements 12, the red photoelectric conversion elements 13, and the infrared photoelectric conversion elements 14 are simply termed the photoelectric conversion elements when they are referred to collectively. The photoelectric conversion elements are semiconductor elements such as photodiodes and phototransistors and have no ability to select the wavelengths; therefore, color filters have to be provided on these photoelectric conversion elements to obtain a color image.

The solid-state imaging device 8 includes an infrared cut filter (IRCF) and color filters in this order on the top surfaces of the photoelectric conversion elements. The color filters are filters that transmit visible light in specific wavelength ranges of the visible light and attenuate light of the other wavelength ranges. The color filters are produced by photolithography in which the process of applying and exposing/developing a pigment-based color resist to form a pattern is repeated for blue (B), green (G), and red (R) colors. The IRCF is a filter that cuts the infrared light and transmits the visible light. The IRCF is produced generally by a method using vapor deposition. The IRCF is a thin film that is formed by layering vapor-deposited substances having different refractive indices in a combination of determined thicknesses. The film thicknesses of each layer are properly designed to give a characteristic to attenuate only the infrared light wavelength range and transmit light in the other wavelength ranges.

A pixel circuit that processes signals from the photoelectric conversion elements and pads that are in charge of power supply and exchange of signals with an external source are disposed on the semiconductor substrate 100. Generally, a passivation film is formed on the IC surface. However, in the solid-state imaging device 8, the color filters are layered on the photoelectric conversion elements and thus characteristics change in the interface between the color filters and the passivation film. Therefore, the passivation film (the hatched line area in FIG. 2) of the solid-state imaging device 8 is eliminated in the area above the photoelectric conversion elements as shown in FIG. 2. Here, the difference in spectral sensitivity characteristics between a solid-state imaging device that includes only the color filters with no IRCF on the photoelectric conversion elements and the solid-state imaging device 8 according to Embodiment 1 will be described.

Figure 3:
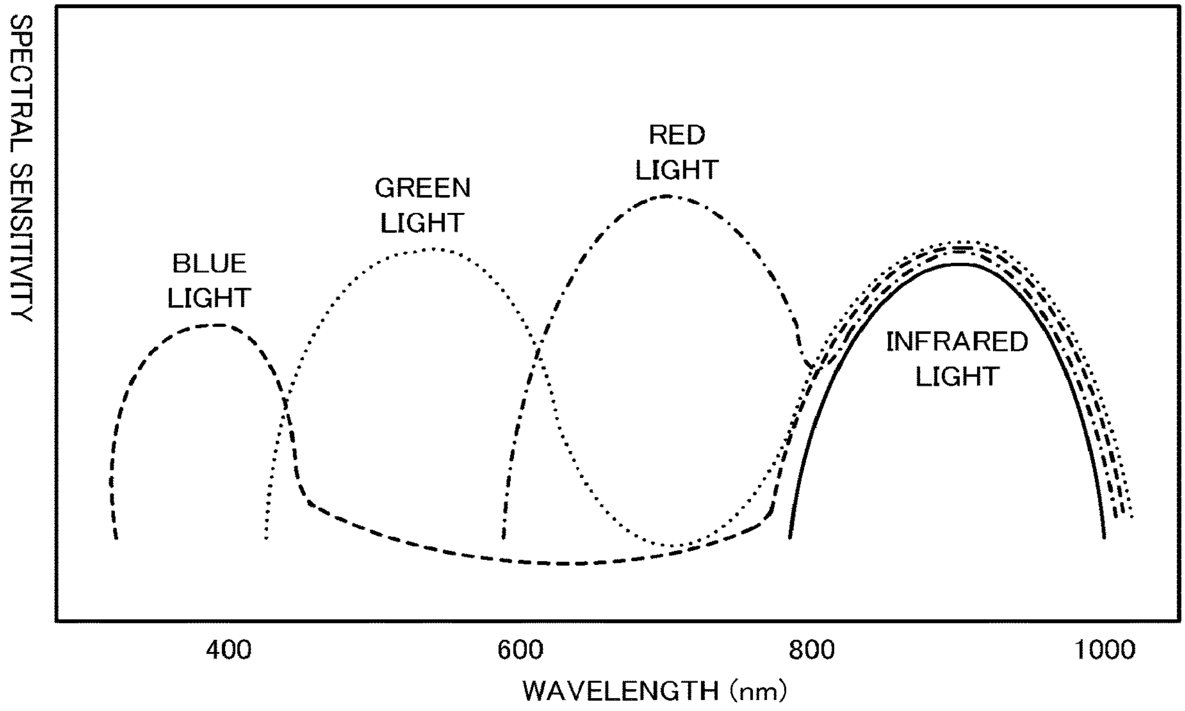
FIG. 3 is a graph that shows spectral sensitivity characteristics of the photoelectric conversion elements of a solid-state imaging device that includes only color filters with no infrared cut filter.

FIG. 3 is a graph that shows the spectral sensitivity characteristics of the photoelectric conversion elements of a solid-state imaging device that includes only the color filters with no IRCF. When only the color filters are provided on the photoelectric conversion elements with no IRCF, as shown in FIG. 3, the blue photoelectric conversion elements 11, the green photoelectric conversion elements 12, and the red photoelectric conversion elements 13 receive not only light that is transmitted through the color filters but also infrared light.

Figure 4:
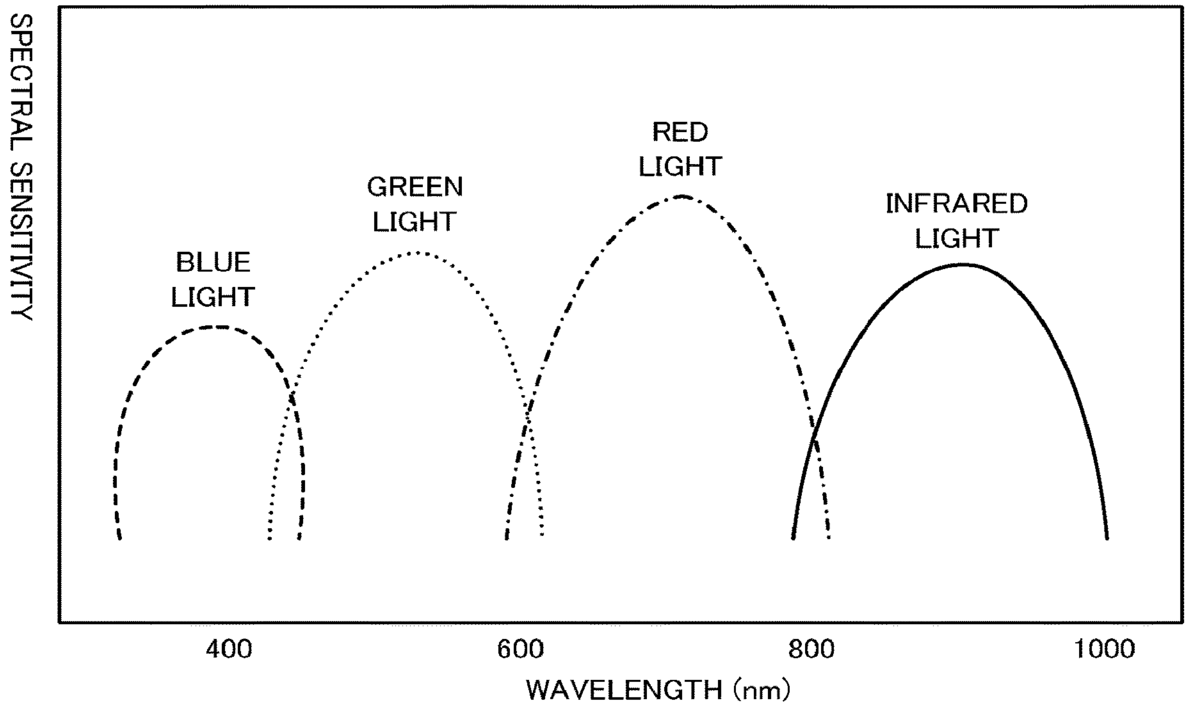
FIG. 4 is a graph that shows the spectral sensitivity characteristics of the photoelectric conversion elements of the solid-state imaging device according to Embodiment 1.

FIG. 4 is a graph that shows the spectral sensitivity characteristics of the photoelectric conversion elements of the solid-state imaging device according to Embodiment 1. With an IRCF and the color filters mounted on the photoelectric conversion elements as in the solid-state imaging device 8, the blue photoelectric conversion elements 11, the green photoelectric conversion elements 12, the red photoelectric conversion elements 13, and the infrared photoelectric conversion elements 14 respectively receive only blue light, green light, red light, and infrared light, and the spectral sensitivity characteristics of the photoelectric conversion elements as shown in FIG. 4 are obtained. Subsequently, the difference between a solid-state imaging device in which the color filters and the IRCF are layered in this order on the photoelectric conversion elements and the solid-state imaging device 8 according to Embodiment 1 will be described.

Figure 5:
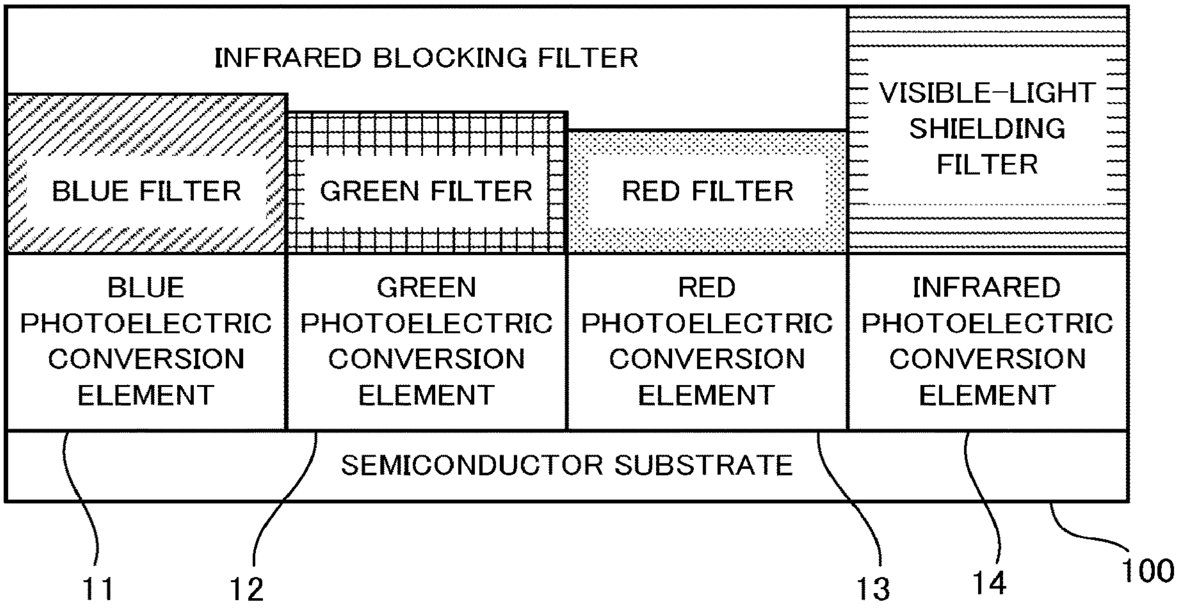
FIG. 5 is a schematic cross-sectional view that shows the layering of a solid-state imaging device in which color filters and an infrared cut filter are layered in this order on photoelectric conversion elements.

FIG. 5 is a schematic cross-sectional view that shows the layering of a solid-state imaging device in which the color filters and the IRCF are layered in this order on the photoelectric conversion elements. The film thicknesses of the color filters are determined according to the color purity of light of wavelengths desired to be transmitted. The film thicknesses of the color filters are different between the colors and, for example, the blue filter is 2.1 μm, the green filter is 1.9 μm, and the red filter is 1.8 μm. Therefore, in the structure in which the color filters are layered on the photoelectric conversion elements and the IRCF is layered on the color filters, the step that exists between adjoining color filters as shown in FIG. 5 may cause problems such as leaking into adjoining pixels and unstable characteristics of the vapor-deposited film of the IRCF due to insufficient flatness.

Figure 6:
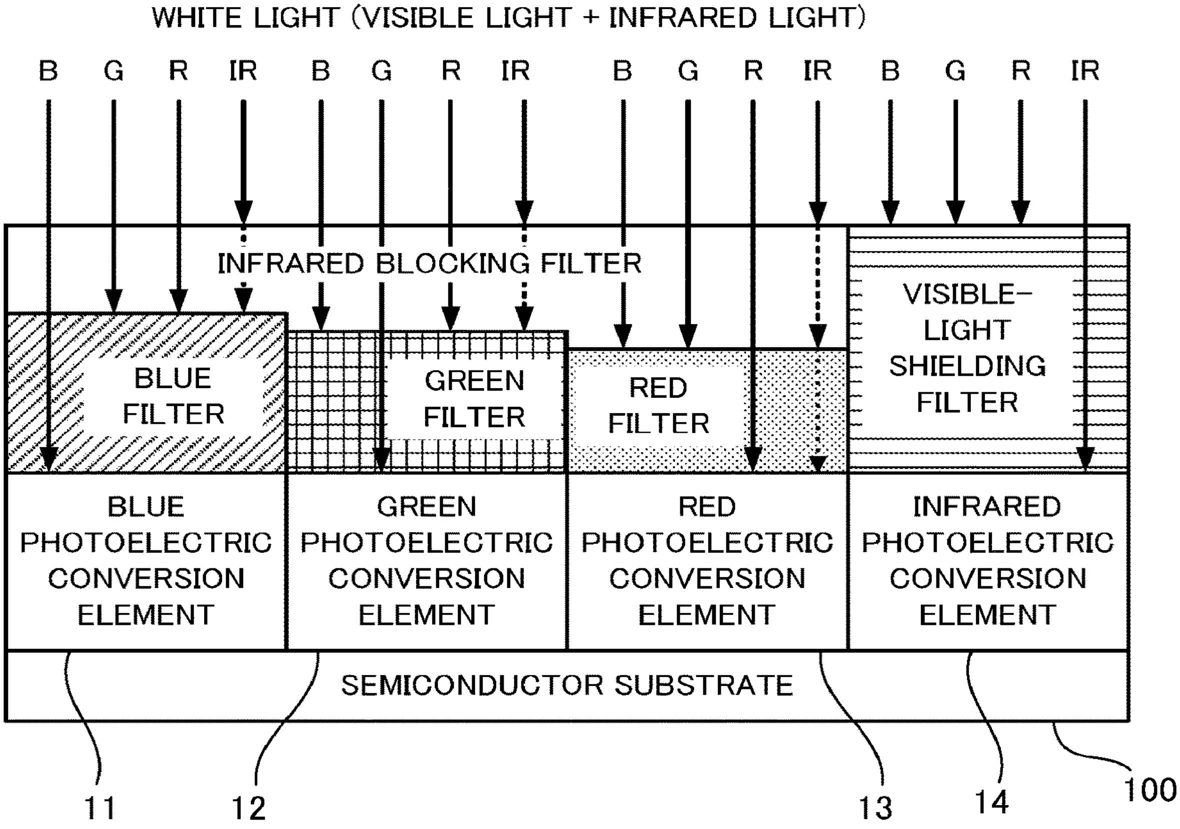
FIG. 6 is a diagram that shows an optical action of a solid-state imaging device in which color filters and an infrared cut filter are layered in this order on photoelectric conversion elements.

FIG. 6 is a diagram that shows the optical action of a solid-state imaging device in which the color filters and the IRCF are layered in this order on the photoelectric conversion elements. As shown in FIG. 6, when the color filters and the IRCF are layered in this order on the photoelectric conversion elements, as white light (visible light+infrared light) enters from above, the IRCF exhibits different characteristics depending on the wavelength, and thus the light enters the color filters in a state of a different intensity distribution than before passing through the IRCF. The IRCF is unstable in the characteristic to cut the infrared light because of the step that exists between the underlying color filters and therefore may transmit part of the infrared light. The red filter transmits light of wavelengths around 800 nm and therefore, the red photoelectric conversion elements 13 that detect red light detect the part of the infrared light as red light.

Figure 7:
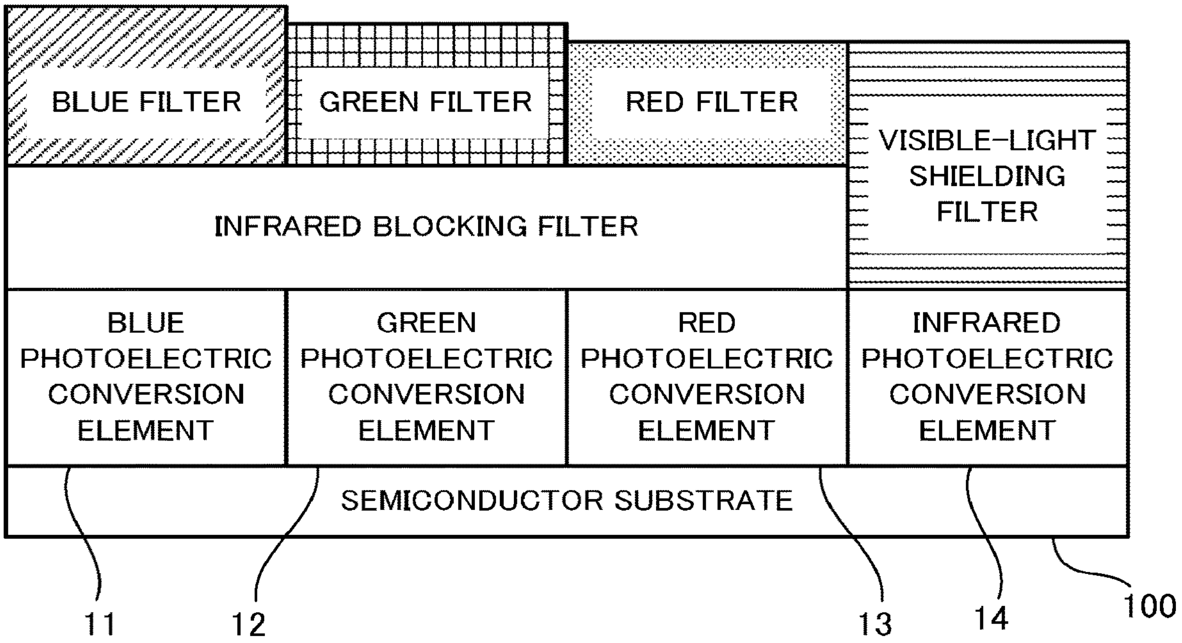
FIG. 7 is a schematic cross-sectional view that shows the layering of the solid-state imaging device according to Embodiment 1.

FIG. 7 is a schematic cross-sectional view that shows the layering of the solid-state imaging device according to Embodiment 1. In the solid-state imaging device 8, the IRCF is evenly layered on the blue photoelectric conversion element 11, the green photoelectric conversion element 12, and the red photoelectric conversion element 13 that respectively receive light of blue (B), green (G), and red (R) wavelengths of the visible light. A visible-light shielding filter is layered on the infrared photoelectric conversion element 14 that receives infrared light. A blue filter that transmits light of blue (B) wavelengths is layered on the IRCF above the blue photoelectric conversion element 11. A green filter that transmits light of green (G) wavelengths is layered on the IRCF above the green photoelectric conversion element 12. A red filter that transmits light of red (R) wavelengths is layered on the IRCF above the red photoelectric conversion element 13. As shown in FIG. 7, a vapor-deposited film of the IRCF is first layered on the individual photoelectric conversion elements and their respective color filters are layered on the IRCF, thereby enabling stable forming of the vapor-deposited film, stable characteristics of the IRCF, and suppression or prevention of leaking into adjoining pixels. Thus, an excellent quality color image can be obtained.

Figure 8:
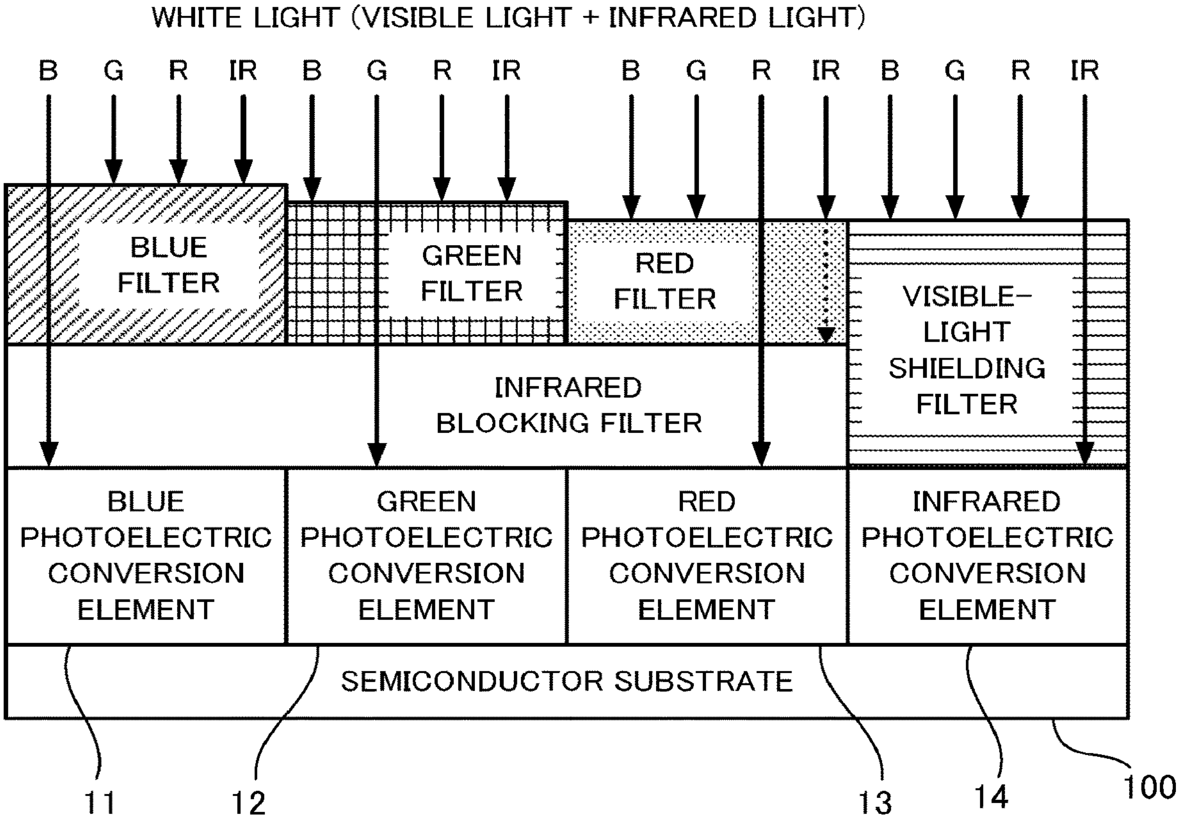
FIG. 8 is a diagram that shows an optical action of the solid-state imaging device according to Embodiment 1.

FIG. 8 is a diagram that shows the optical action of the solid-state imaging device according to Embodiment 1. In the solid-state imaging device 8, as shown in FIG. 8, as white light (visible light+infrared light) enters from above, the light passes through the individual color filters and then passes through the IRCF. Therefore, the light of wavelengths other than the visible light range enters the IRCF in an attenuated state and the effect of further attenuating the infrared light that remains after the red filter is obtained. As a result, an unblurred, excellent quality color image can be obtained. Here, the difference in operation timing between a solid-state imaging device in which the color filters and the IRCF are layered in this order on the photoelectric conversion elements and the solid-state imaging device 8 according to Embodiment 1 will be described.

Figure 9:
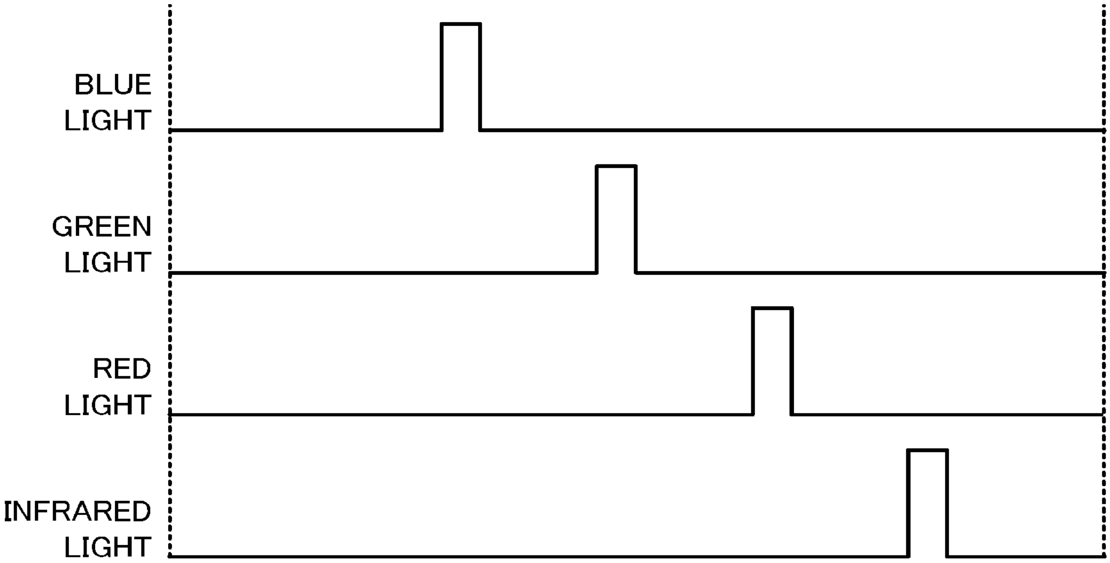
FIG. 9 is a chart that shows an operation timing of a solid-state imaging device in which color filters and an infrared cut filter are layered in this order on photoelectric conversion elements.

FIG. 9 is a chart that shows the operation timing of a solid-state imaging device in which the color filters and the IRCF are layered in this order on the photoelectric conversion elements. In the case of a solid-state imaging device in which the color filters and the IRCF are layered in this order on the photoelectric conversion elements, as described above, as white light (visible light+infrared light) is emitted, leaking into adjoining pixels may occur and the red photoelectric conversion elements 13 may detect part of the infrared light as red light. Thus, in order to obtain an excellent quality color image it is necessary to read an image at each of a total of four emissions of blue light, green light, red light, and infrared light as shown in FIG. 9.

Figure 10:
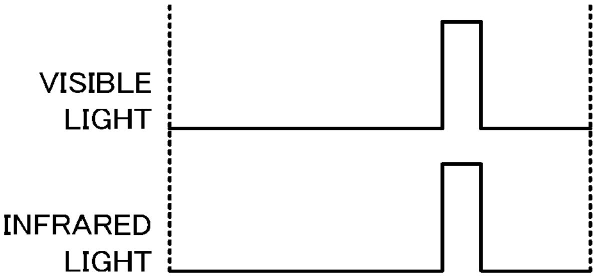
FIG. 10 is a chart that shows an operation timing of the solid-state imaging device according to Embodiment 1.

FIG. 10 is a chart that shows the operation timing of the solid-state imaging device according to Embodiment 1. In the solid-state imaging device 8, as described above, an unblurred, excellent quality color image can be obtained even with emission of white light (visible light+infrared light). Therefore, an image can be read at a time of simultaneous emission of visible light+infrared light as shown in FIG. 10.

As described above, according to the solid-state imaging device 8 of Embodiment 1, the IRCF is first layered on the photoelectric conversion elements and the color filters are layered on the IRCF, thereby enabling suppression or prevention of leaking into adjoining pixels and ensuring the characteristics of the vapor-deposited film. Thus, the reading speed can be improved and an excellent quality color image can be obtained with no additional production step. Moreover, as there is no need to emit blue light, green light, red light, and infrared light sequentially, the reading time can be reduced.

Embodiment 2

In Embodiment 2, the solid-state imaging device 8 for the case in which the image sensor 1 needs to read ink that reacts to ultraviolet light in addition to blue light, green light, red light, and infrared light will be described.

Figure 11:
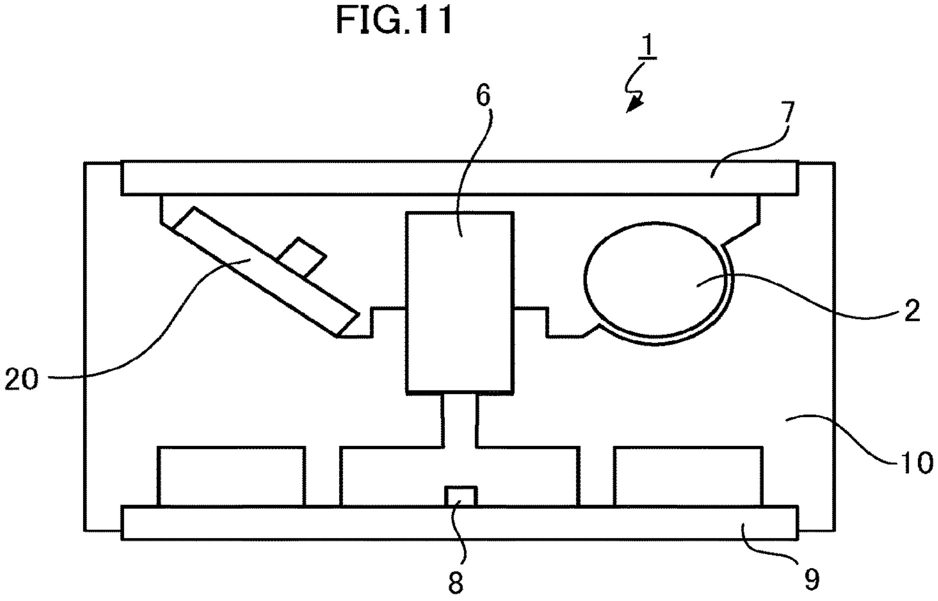
FIG. 11 is a cross-sectional view orthogonal to the main scan direction of an image sensor according to Embodiment 2 of the present disclosure.

FIG. 11 is a cross-sectional view orthogonal to the main scan direction of the image sensor according to Embodiment 2 of the present disclosure. The image sensor 1 according to Embodiment 2 includes a light guide 2 that extends in the main scan direction and emits light from the side to a reading target, ultraviolet light sources 20 that are arranged in the main scan direction and emit ultraviolet light to the reading target, lenses 6 that are arranged in the main scan direction and each form an image of the reading target, a transparent plate 7 that is interposed between the lenses 6 and the reading target, a solid-state imaging device 8 that converts the images that are formed by the lenses 6 to electric signals and outputs the electric signals, a sensor substrate 9 on which the solid-state imaging device 8 is mounted, and an enclosure 10 that holds these members. The light guide 2 and the ultraviolet light sources 20 are juxtaposed in the sub scan direction with the lenses 6 in-between.

Upon emitting visible light and infrared light to an end face of the light guide 2 by a light source, light enters the light guide 2 and propagates in the main scan direction. From the side of the light guide 2, the visible light and the infrared light is emitted to the reading target. The lenses 6 form images of the reading target to which the visible light, the infrared light, and ultraviolet light are emitted on the solid-state imaging device 8. The solid-state imaging device 8 receives and photoelectrically-converts the visible light and the infrared light from the images that are formed by the lenses 6 to electric signals corresponding to the intensity of light that falls on the elements.

The image sensor 1 includes, apart from the solid-state imaging device 8, an UV imaging device that receives and photoelectrically-converts the ultraviolet light from the images that are formed by the lenses 6 to electric signals corresponding to the intensity of light. The layout of the photoelectric conversion elements of the solid-state imaging device 8 of Embodiment 2 is similar to that in FIG. 2. In the solid-state imaging device 8 and the UV imaging device, the passivation film is eliminated on the photoelectric conversion elements as in Embodiment 1. The light source, the light guide 2, and the ultraviolet light sources 20 constitute an emitter. The image sensor 1 may include a light source that emits visible light, infrared light, and ultraviolet light instead of separately including the ultraviolet light sources 20. In such a case, the light source and the light guides 2 constitute an emitter. Moreover, the quantities of the light source and the light guide 2 are not limited to one.

In Embodiment 2, the solid-state imaging device 8 includes an ultraviolet cut filter (UVCF), an IRCF, and the color filters in this order on the top surfaces of the photoelectric conversion elements. The UVCF is a filter that cuts the ultraviolet light and transmits the visible light and the infrared light. The UVCF is produced generally by a method using vapor deposition. The UVCF is a thin film that is formed by layering, on a substrate, vapor-deposited substances having different refractive indices in a combination of determined thicknesses. The film thicknesses of the layers are properly designed to give a characteristic to attenuate only the ultraviolet light wavelength range and transmit light in the other wavelength ranges. The IRCF and the color filters are produced by the same method as stated in Embodiment 1.

Generally, when an image sensor has to read ink that reacts to ultraviolet light, an UVCF is inserted between the lenses and the solid-state imaging device that receives visible light and infrared light. Therefore, different image sensors have to be used depending on whether it is necessary to receive ultraviolet light. Here, the difference between a solid-state imaging device in which the color filters and the IRCF are layered in this order on the photoelectric conversion elements with an UVCF inserted between the lenses and the solid-state imaging device and the solid-state imaging device 8 according to Embodiment 2 will be described.

Figure 12:
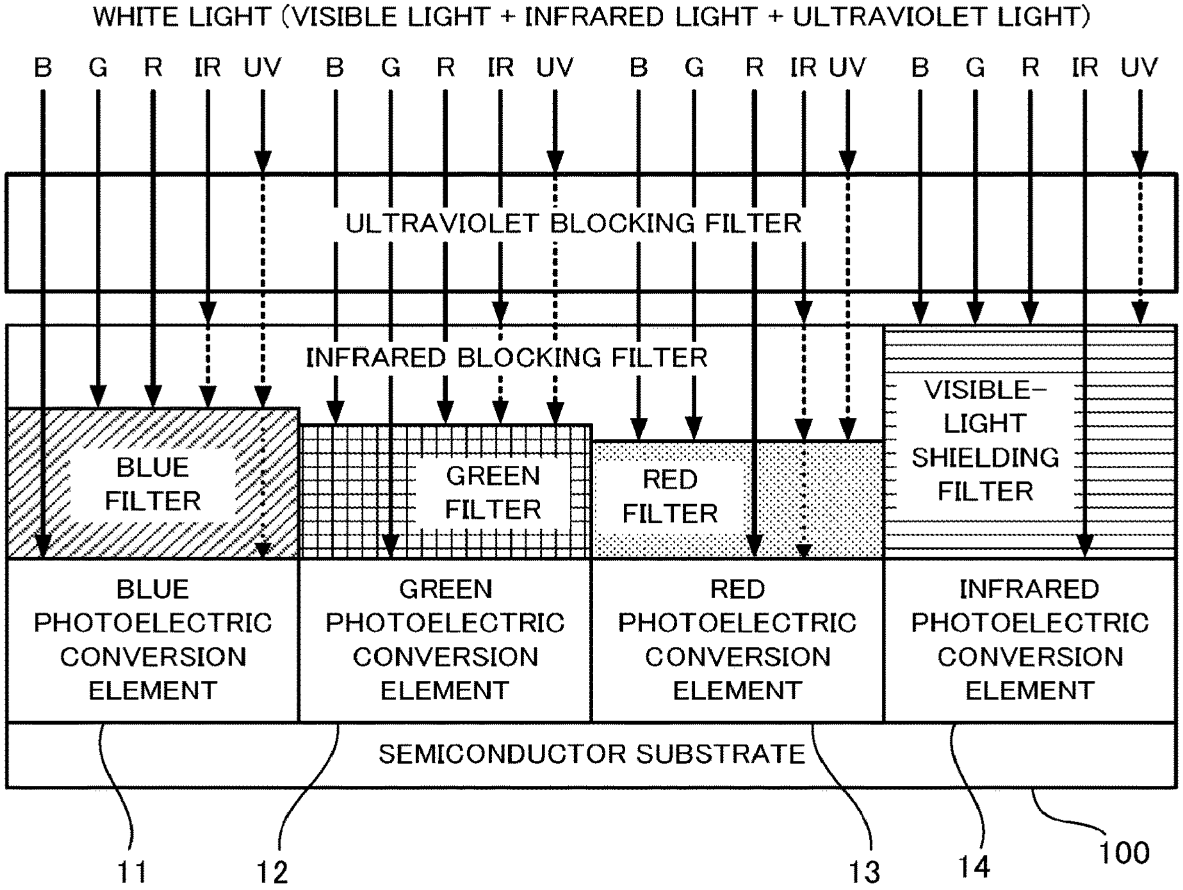
FIG. 12 is a diagram that shows an optical action of a solid-state imaging device in which color filters and an infrared cut filter are layered in this order on photoelectric conversion elements with an ultraviolet cut filter inserted between lenses and the solid-state imaging device.

FIG. 12 is a diagram that shows the optical action of a solid-state imaging device in which the color filters and the IRCF are layered in this order on the photoelectric conversion elements with an UVCF inserted between the lenses and the solid-state imaging device. As shown in FIG. 12, in the case of a solid-state imaging device in which the color filters and the IRCF are layered in this order on the photoelectric conversion elements with an UVCF inserted between the lenses and the solid-state imaging device, as white light (visible light+infrared light+ultraviolet light) enters from above, the UVCF and the IRCF exhibit different characteristics depending on the wavelength, and thus the light enters the color filters in a state of a different intensity distribution than before passing through the UVCF and the IRCF. The IRCF is unstable in the characteristic to cut the infrared light because of the step that exists between the underlying color filters and therefore may transmit part of the infrared light. The red filter transmits light of wavelengths around 800 nm, and thus the red photoelectric conversion elements 13 that detect red light detect the part of the infrared light as red light.

In FIG. 12, the top surface of the IRCF is shown as a flat surface. However, the step that exists between the underlying color filters causes the IRCF to have an uneven top surface in practice. Therefore, the UVCF may also be affected by the step that exists between the color filters, and thus be unstable in the characteristic to cut the ultraviolet light and transmit part of the ultraviolet light. The blue filter transmits light of wavelengths of 400 nm and shorter. Therefore, the blue photoelectric conversion elements 11 that detect blue light detect the part of the ultraviolet light as blue light. As in the case of FIG. 5 and FIG. 6, the step that exists between adjoining color filters may cause problems such as leaking into adjoining pixels and unstable characteristics of the vapor-deposited film of the IRCF due to insufficient flatness.

Figure 13:
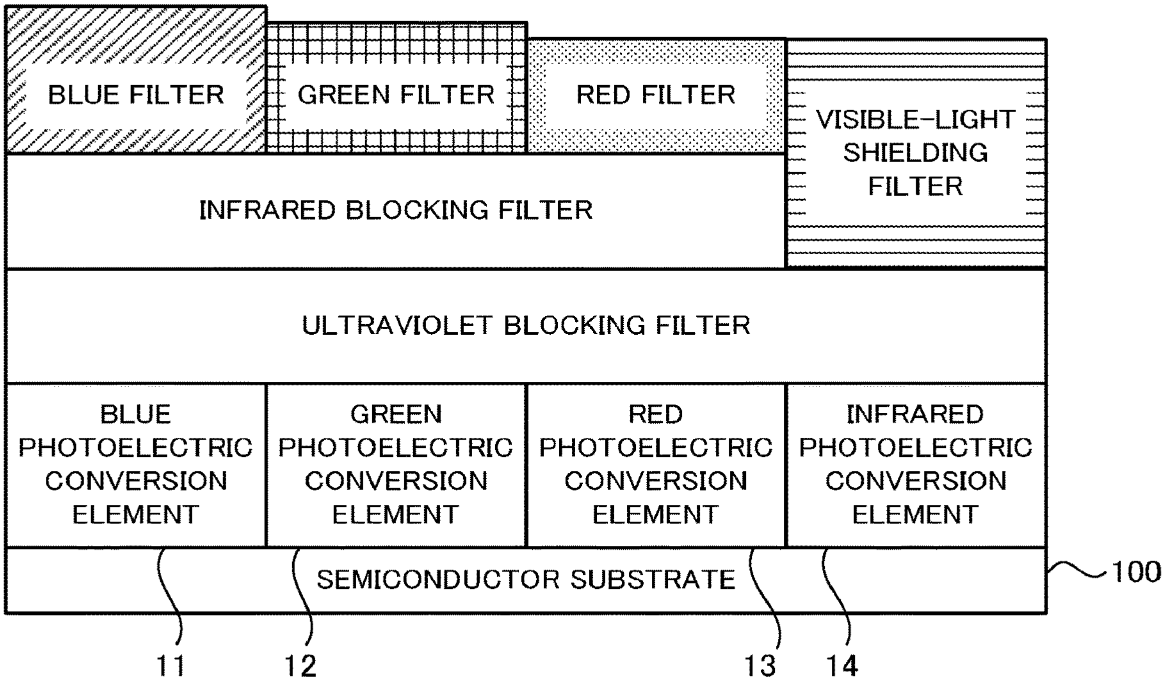
FIG. 13 is a schematic cross-sectional view that shows layering of a solid-state imaging device according to Embodiment 2.

FIG. 13 is a schematic cross-sectional view that shows the layering of the solid-state imaging device according to Embodiment 2. In the solid-state imaging device 8, the UVCF is evenly layered on all photoelectric conversion elements. The IRCF is evenly layered on the UVCF above the blue photoelectric conversion element 11, the green photoelectric conversion element 12, and the red photoelectric conversion element 13 that respectively receive light of blue (B), green (G), and red (R) wavelengths of the visible light. A visible-light shielding filter is layered on the UVCF above the infrared photoelectric conversion element 14 that receives infrared light.

A blue filter that transmits light of blue (B) wavelengths is layered on the IRCF above the blue photoelectric conversion element 11. A green filter that transmits light of green (G) wavelengths is layered on the IRCF above the green photoelectric conversion element 12. A red filter that transmits light of red (R) wavelengths is layered on the IRCF above the red photoelectric conversion element 13.

As shown in FIG. 13, a vapor-deposited film of the UVCF is first layered on the photoelectric conversion elements and a vapor-deposited film of the IRCF is layered on the UVCF above each of the blue photoelectric conversion element 11, the green photoelectric conversion element 12, and the red photoelectric conversion element 13. Then, the color filters are layered on the IRCF, thereby enabling the stable forming of the vapor-deposited film, stable characteristics, and suppression or prevention of leaking into the adjoining pixels. Thus, an excellent quality color image can be obtained.

Figure 14:
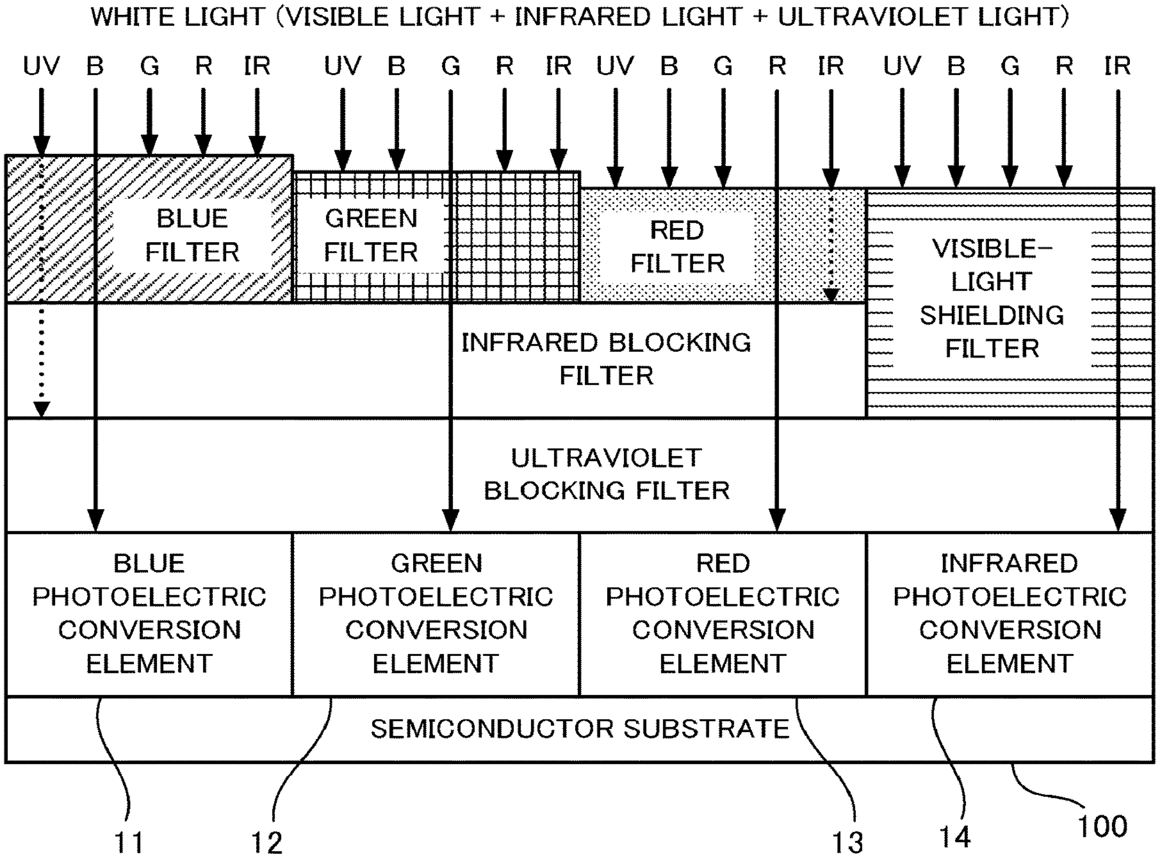
FIG. 14 is a chart that shows an optical action of the solid-state imaging device according to Embodiment 2.

FIG. 14 is a diagram that shows the optical action of the solid-state imaging device according to Embodiment 2. In the solid-state imaging device 8, as shown in FIG. 14, as white light (visible light+infrared light+ultraviolet light) enters from above, the light passes through the individual color filters and then passes through the IRCF and the UVCF. Therefore, the light of wavelengths other than the visible light range enters the IRCF and the UVCF in an attenuated state, and the effect of (i) further attenuating the red light that remains after the red filter and (ii) further attenuating the ultraviolet light that remains after the blue filter is obtained. Also, since the IRCF and the UVCF each have a uniform film thickness and are stable in the characteristic to cut light, their intrinsic attenuation characteristics are obtained. As a result, the infrared light that enters the red photoelectric conversion elements 13 and the ultraviolet light that enters the blue photoelectric conversion elements 11 can be reduced. Therefore, an unblurred, excellent quality color image can be obtained.

Figure 15:
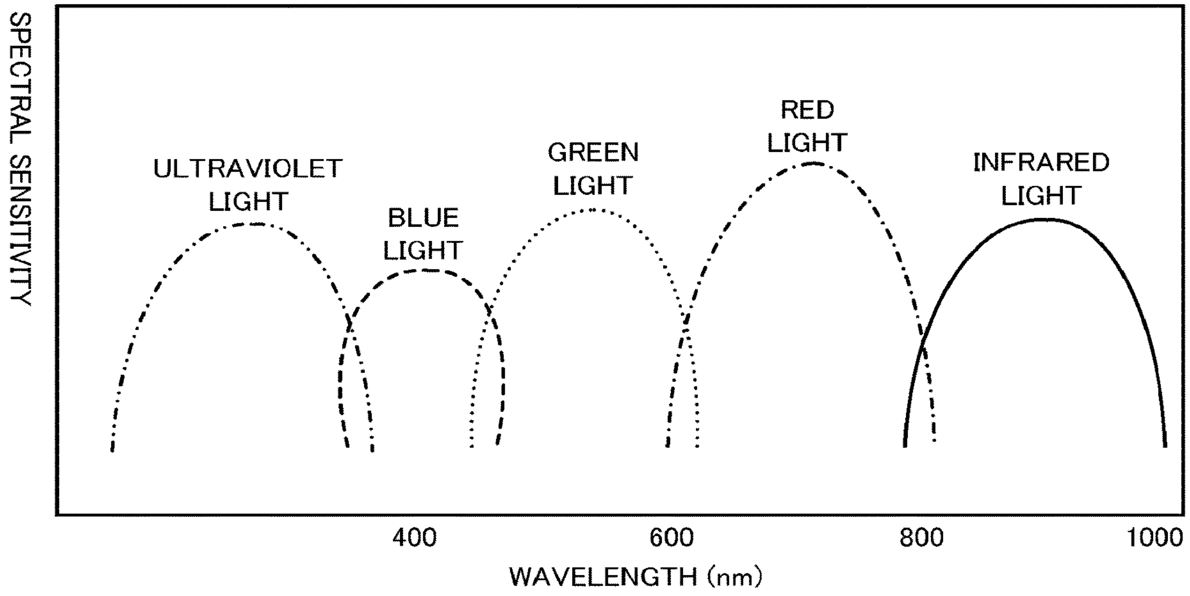
FIG. 15 is a graph that shows spectral sensitivity characteristics of photoelectric conversion elements of the solid-state imaging device according to Embodiment 2 and another solid-state imaging device.

FIG. 15 is a graph that shows the spectral sensitivity characteristics of the photoelectric conversion elements of the solid-state imaging device according to Embodiment 2 and another solid-state imaging device. With the UVCF, the IRCF, and the color filters being mounted in this order on the photoelectric conversion elements as in the solid-state imaging device 8, the blue photoelectric conversion elements 11, the green photoelectric conversion elements 12, the red photoelectric conversion elements 13, and the infrared photoelectric conversion elements 14 of the solid-state imaging device 8 respectively receive blue light, green light, red light, and infrared light, and the photoelectric conversion elements of the other solid-state imaging device receive ultraviolet light, and thus the spectral sensitivity characteristics of the photoelectric conversion elements as shown in FIG. 15 are obtained. Subsequently, the difference in operation timing between a solid-state imaging device in which the color filters and the IRCF are layered in this order on the photoelectric conversion elements with an UVCF inserted between the lenses and the solid-state imaging device and the solid-state imaging device 8 according to Embodiment 2 will be described.

Figure 16:
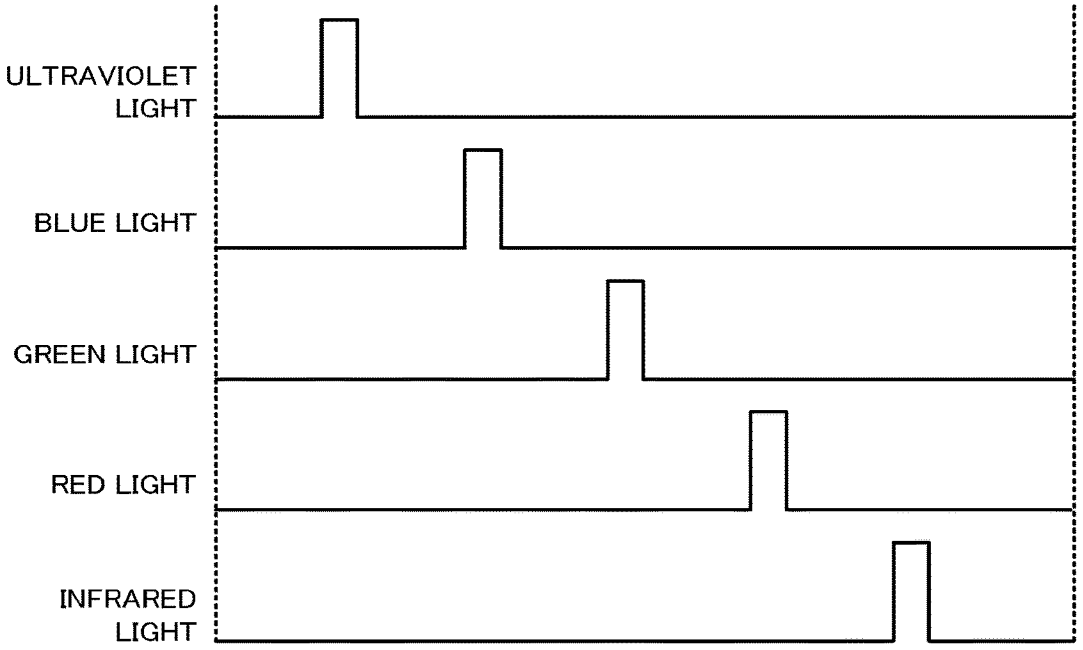
FIG. 16 is a chart that shows an operation timing of a solid-state imaging device in which color filters and an infrared cut filter are layered in this order on photoelectric conversion elements with an ultraviolet cut filter inserted between lenses and a solid-state imaging device.

FIG. 16 is a chart that shows the operation timing of a solid-state imaging device in which the color filters and the IRCF are layered in this order on the photoelectric conversion elements with an UVCF inserted between the lenses and the solid-state imaging device. In the case of a solid-state imaging device in which the color filters and the IRCF are layered in this order on the photoelectric conversion elements with an UVCF inserted between the lenses and the solid-state imaging device, as described above, as white light (visible light+infrared light+ultraviolet light) is emitted, leaking into adjoining pixels may occur, and consequently, the red photoelectric conversion elements 13 may detect part of the infrared light as red light and the blue photoelectric conversion elements 11 may detect part of the ultraviolet light as blue light. Thus, in order to obtain an excellent quality color image, it is necessary to read an image at each of a total of five emissions of ultraviolet light, blue light, green light, red light, and infrared light as shown in FIG. 16.

Figure 17:
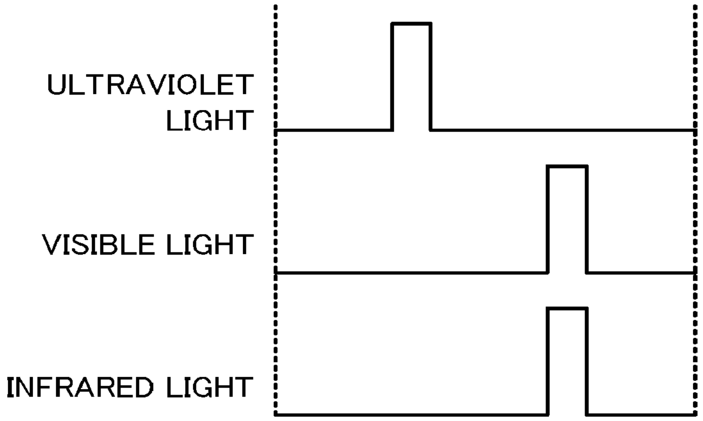
FIG. 17 is a chart that shows an operation timing of the solid-state imaging device according to Embodiment 2.

FIG. 17 is a chart that shows the operation timing of the solid-state imaging device according to Embodiment 2. In the solid-state imaging device 8, as described above, an unblurred, excellent quality color image can be obtained even with emission of white light (visible light+infrared light+ultraviolet light). Thus, as shown in FIG. 17, an image with two emissions can be read, the two emissions being (i) a simultaneous emission of visible light+infrared light and (ii) an emission of ultraviolet light. Here, when the image sensor 1 includes a light source that emits visible light, infrared light, and ultraviolet light instead of separately including the ultraviolet light sources 20, an image may be read at a time with a simultaneous emission of visible light+infrared light+ultraviolet light.

As described above, according to the solid-state imaging device 8 of Embodiment 2, vapor-deposited films of the UVCF and the IRCF are first layered on the photoelectric conversion elements and the color filters are layered on the IRCF, thereby enabling suppression or prevention of leaking into adjoining pixels, and ensuring characteristics of the vapor-deposited films. Thus, the reading speed can be improved and an excellent quality color image can be obtained with no additional production step even when reading of ink that reacts to ultraviolet light is necessary. Moreover, as there is no need to emit ultraviolet light, blue light, green light, red light, and infrared light sequentially, the reading time can be reduced. Furthermore, since the solid-state imaging device 8 includes an UVCF, the solid-state imaging device 8 and another solid-state imaging device that receives and photoelectrically-converts ultraviolet light can be used in combination in the image sensor 1.

The present disclosure is not confined to an image sensor that receives reflected light from a reading target. The present disclosure is applicable to an image sensor that receives transmitted light from a reading target or an image sensor that receives reflected light and transmitted light from a reading target.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2016-100686, filed on May 19, 2016, the entire disclosure of which is incorporated by reference herein.

REFERENCE SIGNS LIST

1 Image sensor
2 Light guide
3 Light guide casing
6 Lenses
7 Transparent plate
8 Solid-state imaging device
9 Sensor substrate
10 Enclosure
11 Blue photoelectric conversion element
12 Green photoelectric conversion element
13 Red photoelectric conversion element
14 Infrared photoelectric conversion element
20 Ultraviolet light source
100 Semiconductor substrate

The invention claimed is:

1. A solid-state imaging device, comprising:

a red photoelectric conversion element to receive and convert red light to electric signals;

a green photoelectric conversion element to receive and convert green light to electric signals;

a blue photoelectric conversion element to receive and convert blue light to electric signals;

an infrared photoelectric conversion element to receive and convert infrared light to electric signals, wherein the red, green, blue, and infrared photoelectric conversion elements are disposed on a semiconductor substrate;

an infrared cut filter layered on the red photoelectric conversion element, the green photoelectric conversion element with a uniform film thickness, and the blue photoelectric conversion element, the infrared cut filter cutting infrared light;

a red filter layered on the infrared cut filter that is above the red photoelectric conversion element, the red filter transmitting light of red wavelengths;

a green filter layered on the infrared cut filter that is above the green photoelectric conversion element, the green filter transmitting light of green wavelengths;

a blue filter layered on the infrared cut filter that is above the blue photoelectric conversion element, the blue filter transmitting light of blue wavelengths;

a visible-light shielding filter layered on the infrared photoelectric conversion element, the visible-light shielding filter transmitting infrared light and shielding red light, green light, and blue light;

an ultraviolet cut filter layered between (i) the red photoelectric conversion element; the green photoelectric conversion element, and the blue photoelectric conversion element and (ii) the infrared cut filter and between (iii) the infrared photoelectric conversion element and (iv) the visible-light shielding filter with a uniform film thickness, the ultraviolet cut filter transmitting infrared light and visible light and cutting ultraviolet light; and a passivation film formed on a surface of the semiconductor substrate, wherein the passivation film is eliminated in an area above the red, green, blue, and infrared photoelectric conversion elements, thereby exposing the red filter, the green filter, the blue filter, and the visible-light shielding filter.

2. An image sensor, comprising:

the solid-state imaging device according to claim 1;

an emitter to emit visible light, infrared light, and ultraviolet light to a reading target;

a lens to form on the solid-state imaging device an image of the reading target to which visible light, infrared light, and ultraviolet light are emitted by the emitter; and an enclosure to hold the solid-state imaging device, the emitter, and the lens.

* * * * *